United States Patent
Hobart et al.

(10) Patent No.: US 8,723,218 B2
(45) Date of Patent: May 13, 2014

(54) SILICON CARBIDE RECTIFIER

(75) Inventors: Karl D. Hobart, Upper Marlboro, MD (US); Francis J. Kub, Arnold, MD (US); Mario Ancona, Alexandria, VA (US); Eugene A. Imhoff, Washington, DC (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 28 days.

(21) Appl. No.: 13/605,024

(22) Filed: Sep. 6, 2012

(65) Prior Publication Data

US 2013/0240905 A1 Sep. 19, 2013

Related U.S. Application Data

(60) Provisional application No. 61/532,212, filed on Sep. 8, 2011.

(51) Int. Cl.
*H01L 29/74* (2006.01)

(52) U.S. Cl.
USPC ............ 257/119; 438/134; 257/E25.002

(58) Field of Classification Search
USPC ............ 257/77, 119, 658, E25.002, E21.358; 438/134
See application file for complete search history.

(56) References Cited

U.S. PATENT DOCUMENTS

| | | | |
|---|---|---|---|
| 5,831,287 A | 11/1998 | Bakowski et al. | |
| 2007/0090370 A1* | 4/2007 | Nakayama et al. | 257/77 |
| 2010/0032685 A1* | 2/2010 | Zhang et al. | 257/77 |
| 2012/0228734 A1* | 9/2012 | Kamaga et al. | 257/487 |

* cited by examiner

*Primary Examiner* — Quoc Hoang
(74) *Attorney, Agent, or Firm* — US Naval Research Laboratory; Stephen T. Hunnius

(57) ABSTRACT

Silicon carbide PiN diodes are presented with reduced temperature coefficient crossover points by limited p type contact area to limit hole injection in the n type drift layer in order to provide a lower current at which the diode shifts from negative temperature coefficient to a positive temperature coefficient of forward voltage for mitigating thermal runaway.

30 Claims, 14 Drawing Sheets

SILICON CARBIDE RECTIFIER

REFERENCE TO RELATED APPLICATION

This application claims priority to and the benefit of U.S. Provisional Patent Application Ser. No. 61/532,212, filed Sep. 8, 2011, and entitled "Temperature Compensated SiC Power Rectifier", the entirety of which is hereby incorporated by reference.

BACKGROUND

Power rectifiers are used in a variety of applications, such as passive rectifier circuits to rectify AC supply power, and as anti-parallel diodes across an insulated gate bipolar transistor (IGBT), where multiple power rectifiers are often connected in parallel with one another to achieve a desired current rating. PiN diodes are often used in high switching speed applications, and include a lightly doped near-intrinsic region situated between more highly doped P and N regions to facilitate high level injection of carriers from the P and N regions. For high power applications, Silicon Carbide (SiC) PiN rectifiers are sometimes used, where silicon carbide advantageously provides higher breakdown voltage and higher temperature operation compared with traditional silicon devices. However, conventional silicon carbide PiN rectifiers suffer from negative temperature coefficient of forward voltage drop due to the relatively deep acceptor dopant energy level in the p type emitter of the PiN structure. As the rectifier junction temperature increases, carrier (hole) activation in the emitter increases, leading to increased minority carrier injection into the n type base, which in turn leads to increased current flow for a given forward voltage drop. The increased current level, in turn, raises the junction temperature further, leading to thermal runaway, which is particularly problematic when multiple SiC PiN rectifiers are connected in parallel. Consequently, conventional silicon carbide PiN rectifiers suffer from negative temperature coefficient problems. Silicon carbide Schottky rectifiers, on the other hand, have a positive temperature coefficient of forward voltage drop, but have relatively low current densities compared with silicon carbide PiN devices and many more SiC Schottky rectifiers would thus be needed for a given total current level. A need therefore remains for improved power rectifiers, particularly for high power applications, which provide the current density advantages of silicon carbide PiN devices while mitigating the potential for thermal runaway conditions.

SUMMARY OF DISCLOSURE

Various details of the present disclosure are hereinafter summarized to facilitate a basic understanding, where this summary is not an extensive overview of the disclosure, and is intended neither to identify certain elements of the disclosure, nor to delineate the scope thereof. Rather, the primary purpose of this summary is to present some concepts of the disclosure in a simplified form prior to the more detailed description that is presented hereinafter.

Improved PiN diodes or rectifiers are provided that have lower current value for the crossover point. The improved PiN diodes can have lower carrier density in the drift layer for reduced reverse recovery charge and reduced reverse recovery peak currents. The improved PiN diodes can also have temperature compensated operation. Improved PiN diodes or rectifiers are provided having a lower current value for the crossover point at which the overall temperature coefficient of forward voltage drop shifts from a negative temperature coefficient to a positive temperature coefficient by which the current density advantages of conventional SiC PiN diodes may be achieved while mitigating or avoiding thermal runaway conditions. An n type drift layer is provided over an n type silicon carbide or gallium nitride substrate in certain embodiments, where the drift layer has a lower dopant concentration than that of the substrate. A p type anode layer is provided on the drift layer, and one or more p type anode contact structures are disposed on the upper surface of the p type anode layer, having higher dopant concentration than the p type anode layer. The individual p type anode contact structures are laterally spaced from one another and define a total upper surface area that is less than the surface area of the upper surface of the p type anode layer. Metal electrical contacts are formed along the upper surfaces of the p type anode contact structures, and an anode metal layer is connected to the upper surfaces of the metal electrical contacts. The current crowding in the anode layer debiases the anode over a portion of the anode layer. This reduction in the p type anode contact area relative to the anode surface area provides a spreading resistance, where the anode debias increases with current and thereby lowers the current value of the crossover point and results in reduced carrier injection from the anode into the drift layer and thus reduced carrier density in the drift layer and reduced reverse recovery charge. The crossover point is the current value at which the temperature coefficient of the device shifts from a negative temperature coefficient of forward voltage to a positive temperature coefficient of forward voltage. The crossover point is also known as the temperature independent point and is also known as the zero temperature coefficient value. This, in turn, mitigates or overcomes the disadvantages of conventional silicon carbide PiN diodes while providing higher current density operation than similarly-sized silicon carbide Schottky rectifiers.

In certain embodiments, the acceptor doping level in the p type anode layer is significantly reduced and/or the p type anode layer is made very thin, thereby increasing the layer resistivity. This, in turn, causes the crossover point to occur at lower current levels. Moreover, certain embodiments provide a positive temperature coefficient for the metal-semiconductor electrical contact resistance of the p type anode contact structure/metal electrical contact interface, thereby lowering the current value of the silicon carbide PiN power rectifier structure at which the device has a positive temperature coefficient.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION OF THE DISCLOSURE

Figure 2A:
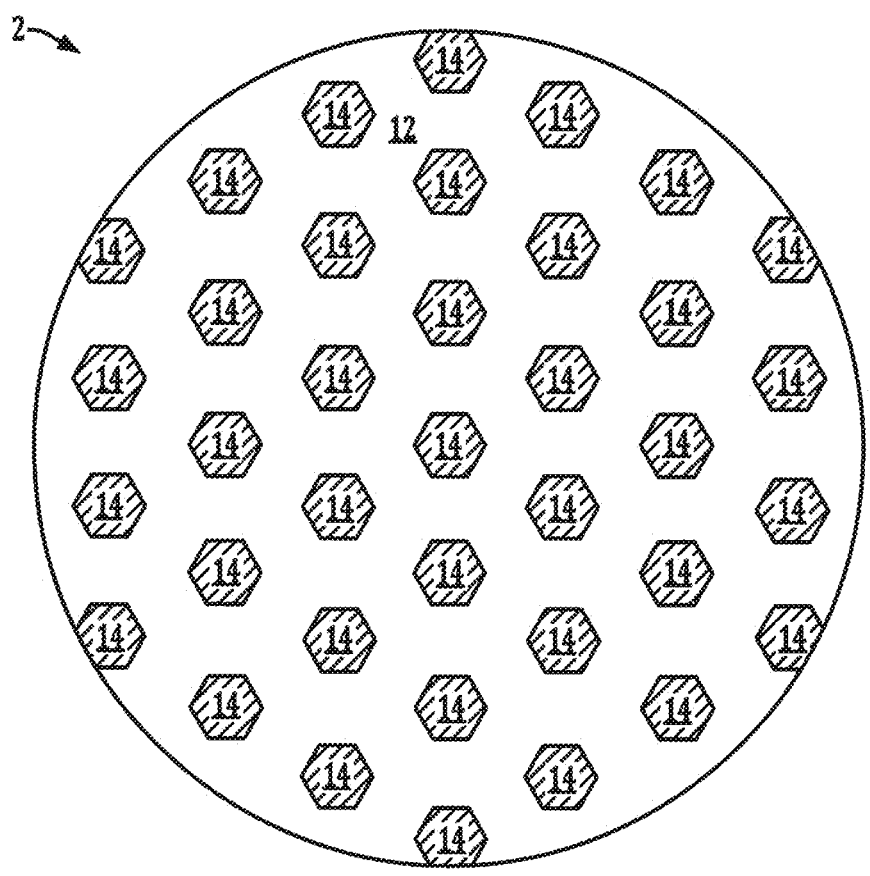
FIGS. 2A-2D are partial sectional top plan views illustrating different p type anode contact structures in the silicon carbide PiN diode taken along line 2-2 in FIG. 1.
Figure 2B:
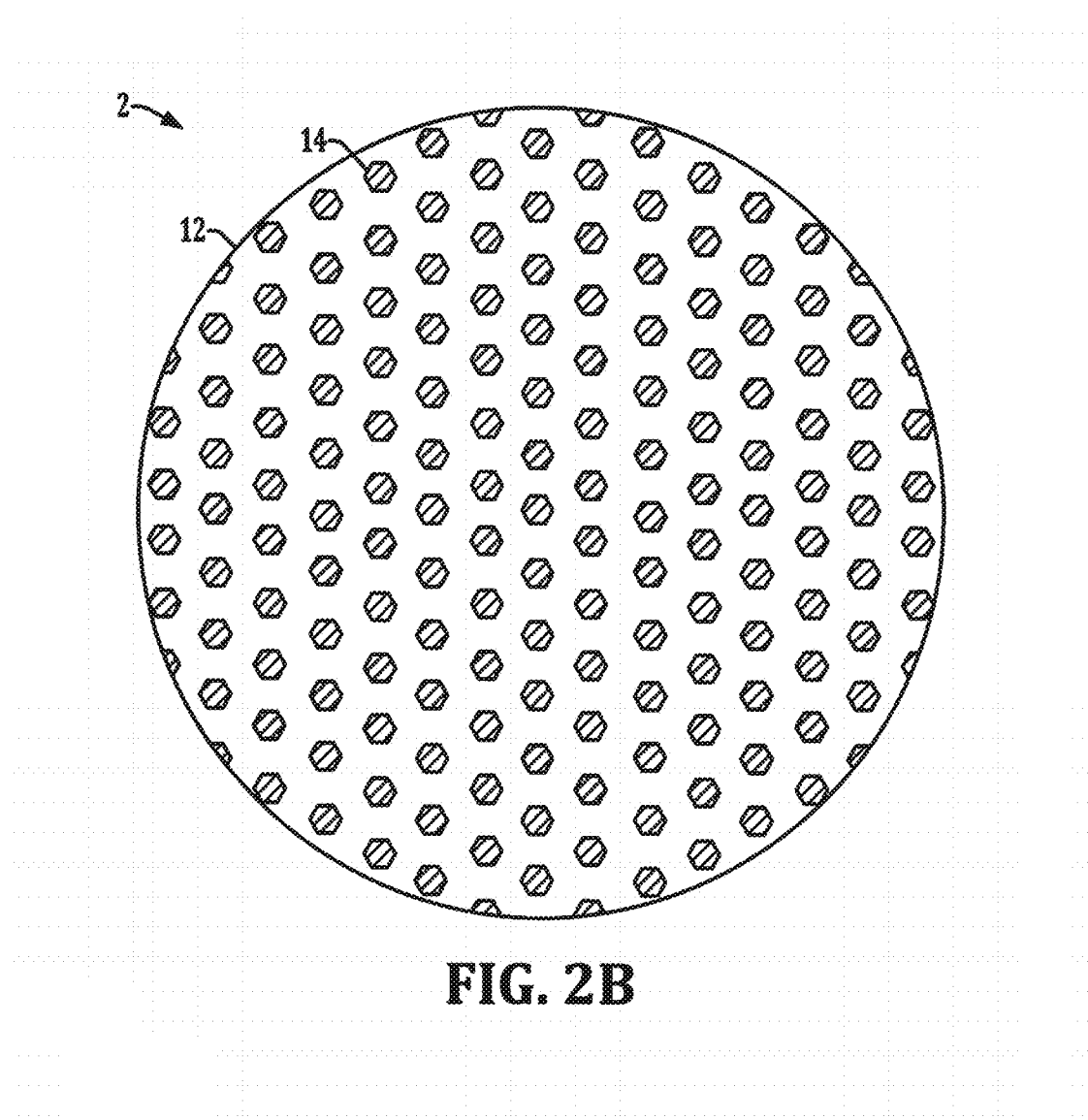
Figure 2C:
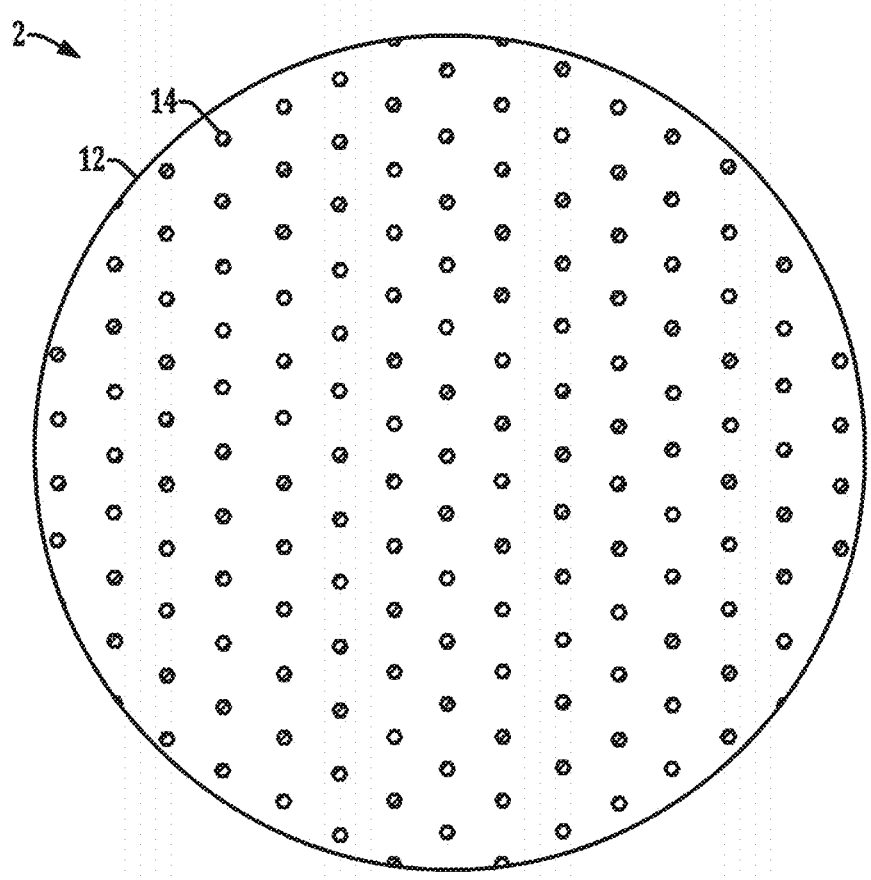
Figure 2D:
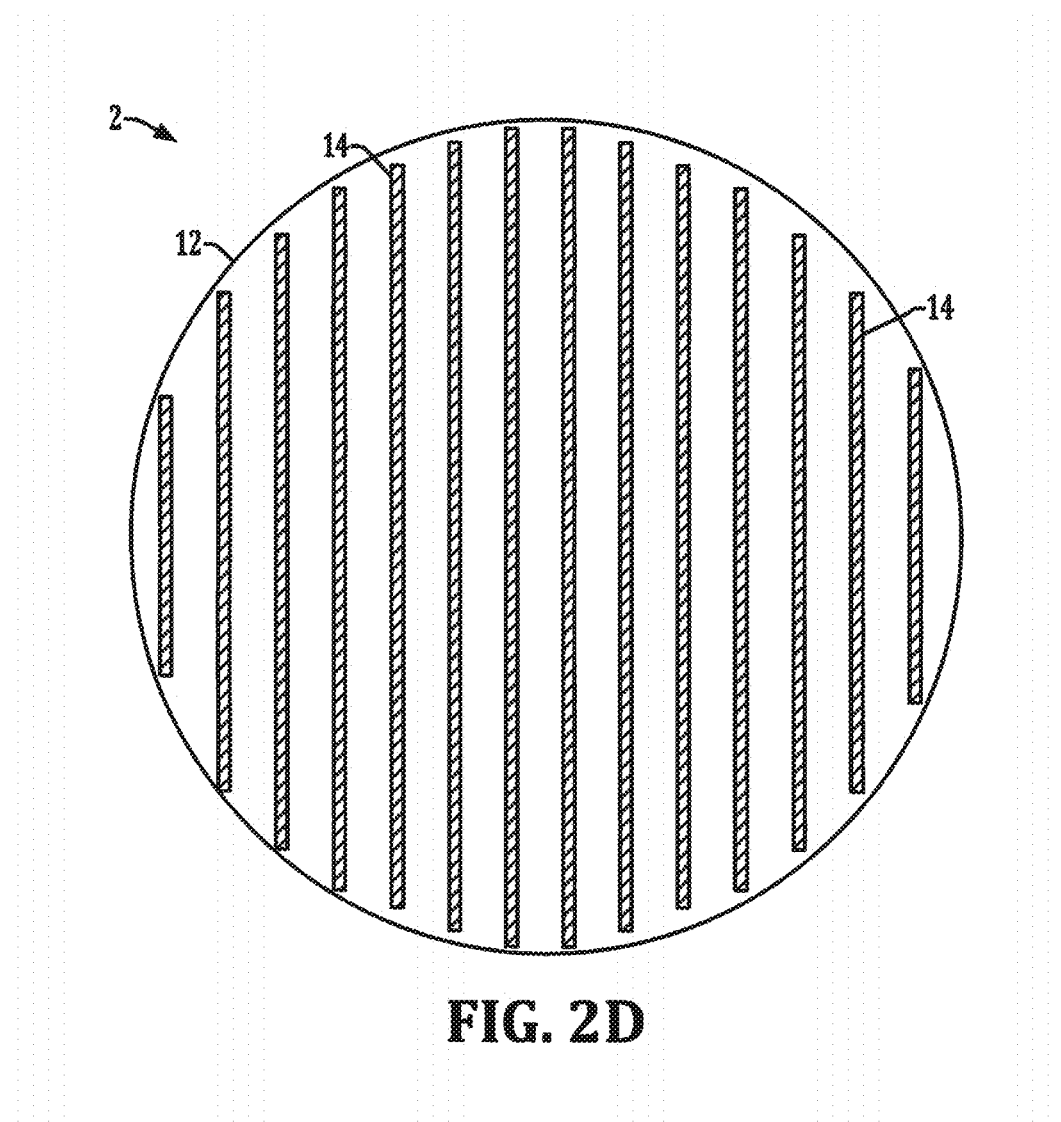
Figure 3:
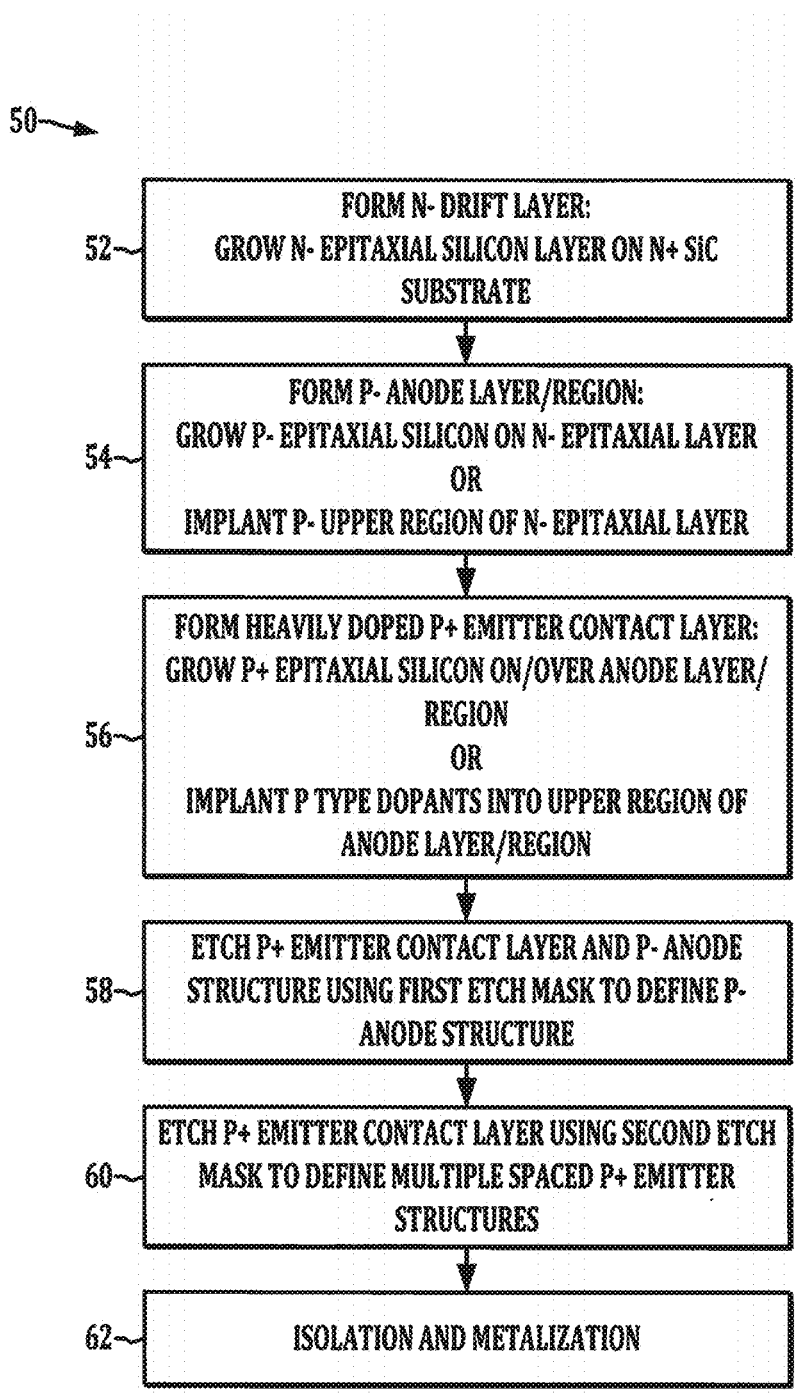
FIG. 3 is a flow diagram illustrating a process for making the PiN diode of FIG. 1.

One or more embodiments or implementations are hereinafter described in conjunction with the drawings, where like reference numerals refer to like elements throughout, and where the various features are not necessarily drawn to scale. FIGS. 1 and 2A-2D illustrate certain embodiments of a low crossover point silicon carbide PiN diode or power rectifier 2 with limited anode contact area in accordance with one or more aspects of the present disclosure, and FIG. 3 shows an exemplary process 50 for fabricating the rectifier 2. Several embodiments of improved SiC PiN diodes or rectifiers are described herein, having reduced or lowered current value for the crossover point between positive and negative temperature coefficient of forward voltage. The improved SiC PiN diodes in certain implementations may advantageously have lower carrier density in the drift layer for reduced reverse recovery charge and reduced reverse recovery peak currents.

Figure 1:
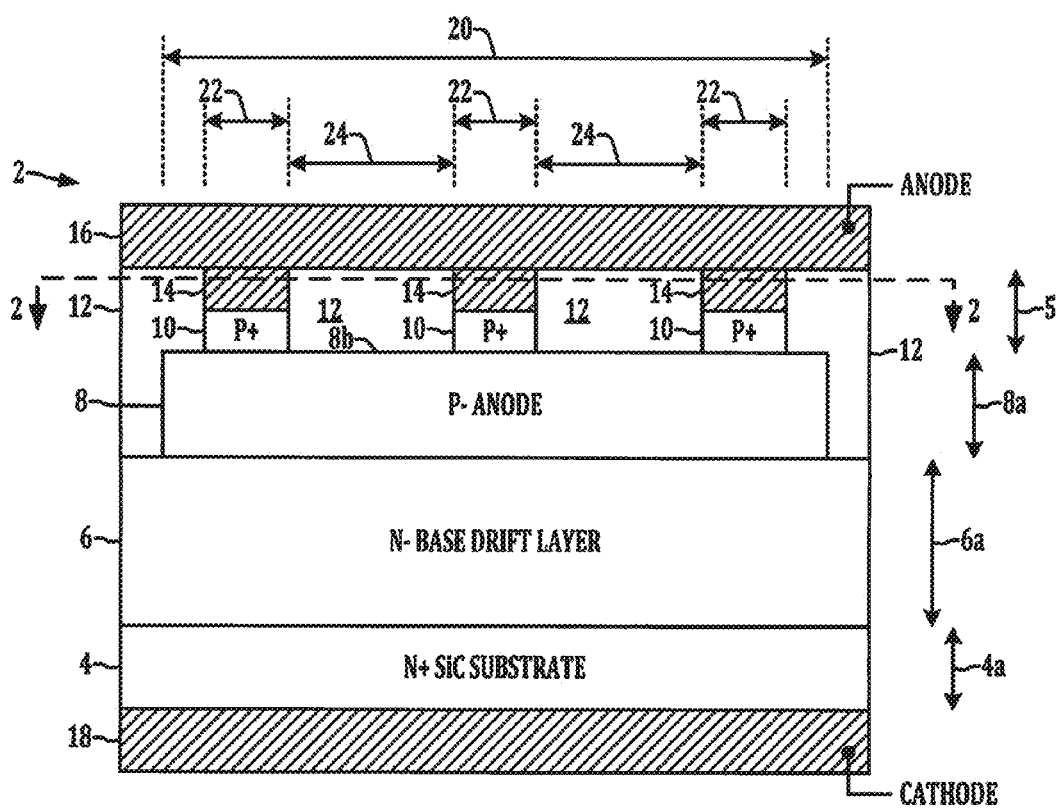
FIG. 1 is a partial sectional side elevation view illustrating an exemplary low crossover point silicon carbide PiN diode with limited anode contact area in accordance with one or more aspects of the present disclosure.

As best seen in FIG. 1, the rectifier 2 includes an n type drift layer 6 having a thickness 6a disposed over an n type silicon carbide substrate 4, where the drift layer 6 has a dopant concentration less than that of the substrate 4 and thus forms an "intrinsic" or near-intrinsic layer in the overall PiN diode 2. Although the illustrated embodiment includes a silicon carbide substrate 4, other embodiments are possible in which a gallium nitride PiN diode 2 is constructed using a gallium nitride substrate 4. The substrate 4 has a thickness $4a$, and is preferably heavily doped with n type dopants. A p type anode layer 8 with a thickness $8a$ and an upper surface $8b$ is disposed on the drift layer 6, and a plurality of p type anode contact structures 10 are formed on the p type anode layer upper surface $8b$. The p type anode contact structures 10 in certain embodiments can optionally include a highly p type layer (not shown) on a surface of the p type anode contact structures 10 to lower the electrical contact resistance between the p-type anode contact structure 10 and the metal electrical contact 14. As seen in FIGS. 1 and 2A-2D, the p type anode contact structures 10 have a lateral dimension 22 and are laterally spaced from one another by spacing distance 24. The p type anode contact structures 10, moreover, are heavily doped p+ structures with a higher dopant concentration than that of the p type anode layer 8. In certain embodiments, the contact resistance is nonlinear with, providing nonlinear increase in forward voltage with current with small increase in forward voltage for low currents and a larger increase in forward voltage for higher currents. The debasing resistance also may create a nonlinear increasing in the forward voltage with current, with small increase in forward voltage for low currents and a larger increase in forward voltage for higher currents. Moreover, the p type anode contact structures 10 have a total upper surface area less than the total surface area of the p type anode layer upper surface $8b$. Metal electrical contacts 14 are disposed along all or at least portions of the upper surfaces of the p type anode contact structures 10 with an interlayer dielectric (ILD) or isolation material 12 (e.g., $SiO_2$, etc.) separating the composite p type anode contact structures 10, 14 from one another to provide contact structures of a vertical dimension 5 shown in FIG. 1, and an overlay metal layer (anode metal layer) 16 is connected to the upper surfaces of the metal electrical contacts 14. In addition, as seen in FIG. 1, a cathode metal layer 18 is connected to the lower surface of the silicon carbide substrate. The metal electrical contact 14 can optionally be self aligned to the p-type anode contact structures 10 or have a contact with the surface of the p type anode contact structures 10 that is smaller than the surface area of the p type anode contact structures 10. The metal electrical contact 14 in certain embodiments can make an electrical contact with the surface of 10 with the metal electrical contact 14 being optionally non-ohmic or optionally ohmic.

The reduced area p type anode contact structures 10 advantageously provide resistance in the rectifier 2 which has a positive temperature coefficient with respect to applied forward voltage. In this regard, the inventors have appreciated that the PiN diode forward voltage equation $V_f = j(R_{cp} + R_p) + V_{pn} + V_L + V_{EH}) + j(R_n + R_{cp})$ includes a p+ electrical contact resistance term $R_{cp}$ with a positive temperature coefficient at moderate doping levels of the p type anode contact structures, and the electrical contact resistance of the anode can be adjusted such that the overall power rectifier device 2 has a positive temperature coefficient with respect to forward voltage over all or at least a designated range of applied forward voltages and current densities. This is done in the device 2 of FIG. 1, at least in part, by making the total upper surface area of the p type anode contact structures 10 to be less than the area of the upper surface $8b$ of the p type anode structure 8. As shown in FIG. 1, the anode structure 8 has a lateral dimension 20, and the sum of the corresponding lateral dimensions 22 of the p type anode contact structures 10 is less than the p type anode layer structure dimension 20.

Moreover, in the illustrated embodiments, the total upper surface area of the p type anode contact structures 10 is less than the total area of the p type anode layer 8. In certain embodiments, the p type anode contact structures area is about 50% or less than the p type anode layer upper surface area. In more particular embodiments, the p type anode contact structure area as of less than or equal to about 20% of the p type anode layer surface area, such as about 10% or less in specific embodiments, and about 5% or less or about 2% or less in particular embodiments. The contact structures 10 in various embodiments can be any suitable shape, vertical height, and more than one shape may be used in constructing a given embodiment of a low crossover point silicon carbide power rectifier 2. For example, FIGS. 2A-2C illustrate top plan views taken along line 2-2 in FIG. 1, in which hexagonal shaped p type anode contact structures 10 and corresponding metal electrical contacts 14 are used. In these three examples, the contact structure lateral dimensions 22 and the spacings 24 therebetween are modified to provide different overall ratios between the contact area and the anode area. Moreover, as seen in FIG. 2D, laterally extending lines or "fingers" can be used for the composite contact structures 10, 14 in other embodiments. Further embodiments are contemplated in which other forms and shapes of the contact structures 10, 14 can be used, including without limitation curvilinear lines, rectangular shapes, elongated shapes, circular shapes, etc. and/or combinations thereof. In this regard, any suitable combination of p type anode contact structures 10 and corresponding metal electrical contact structures 14 can be used by which the total upper surface area of the contact structures 10 is less than the surface area of the upper surface 8b of the p type anode layer 8.

In addition to the reduced surface area contact structure configuration, reduction in the temperature coefficient crossover point of the power rectifier 2 can be accomplished and/or facilitated by reducing the acceptor doping of the p type anode layer 8 and/or by making the p type anode layer 8 so as to increase the resistance and thereby causing the biasing to occur at lower device current levels. In this regard, the p type p type anode layer 8 in certain embodiments has a p type dopant concentration (e.g., boron or other suitable p type dopant(s)) of about $1 \times 10^{17}$ cm$^{-3}$ to $1 \times 10^{19}$ cm$^{-3}$ or less, such as about $1 \times 10^{17}$ cm$^{-3}$ or more and about $1 \times 10^{18}$ cm$^{-3}$ or less in more particular embodiments, for instance about $1 \times 10^{17}$ cm$^{-3}$ in one example. Moreover, the thickness 8a of the p type anode layer 8 in certain embodiments is about 0.1 μm or more and about 10.0 μm or less, such as about 0.1 μm to 1.0 μm in certain examples, and about 0.1 μm in one particular embodiment.

Moreover, the metal-semiconductor contact resistance associated with the p type anode contact structures 10 and the overlying metal electrical contact structures 14 can be tailored in certain embodiments such that the contact resistance itself increases with increasing temperature according to the formula $R(T)=R_0 \cdot (T/T_0)^\delta$, where R is the contact resistance, $R_0$ is the contact resistance at a temperature $T_0$, T is temperature, and δ is a positive coefficient reflecting the degree with which the contact resistance changes with temperature. In this regard, the polarity of δ is determined by the doping concentration in the p+ structures 10 and the type of metal used for making the electrical contacts 14, wherein certain embodiments provide controlled engineering of the metal material 14 and the doping of the contact structures 10 to provide a δ having a value of about +1.5 or more, such as approximately +2 in certain embodiments. In certain contemplated embodiments, moreover, the metal electrical contacts 14 can be ohmic and may provide a contact resistance Rc with the corresponding p type anode contact structures 10 of about $1 \times 10^{-6}$ Ω cm$^2$ or more and about $1 \times 10^{-2}$ Ω cm$^2$ or less, such as about $2 \times 10^{-5}$ Ω cm$^2$ or more and about $5 \times 10^{-5}$ Ω cm$^2$ or less in certain embodiments, and about $1 \times 10^{-3}$ Ω cm$^2$ in certain embodiments.

Figure 4A:
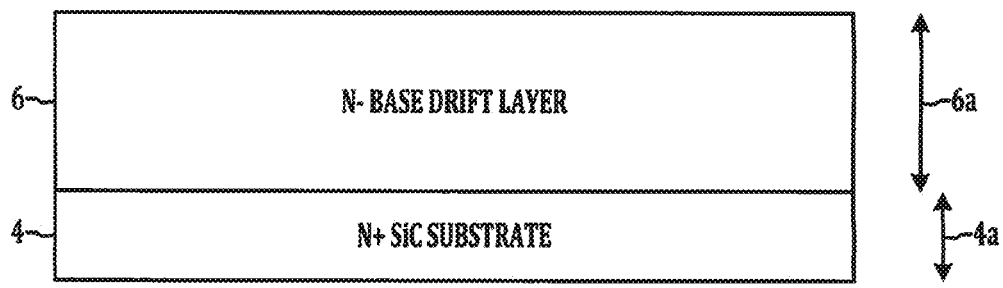
FIGS. 4A-4G are partial sectional side elevation views illustrating fabrication of the silicon carbide PiN diode of FIG. 1 at various intermediate stages of fabrication.
Figure 4B:
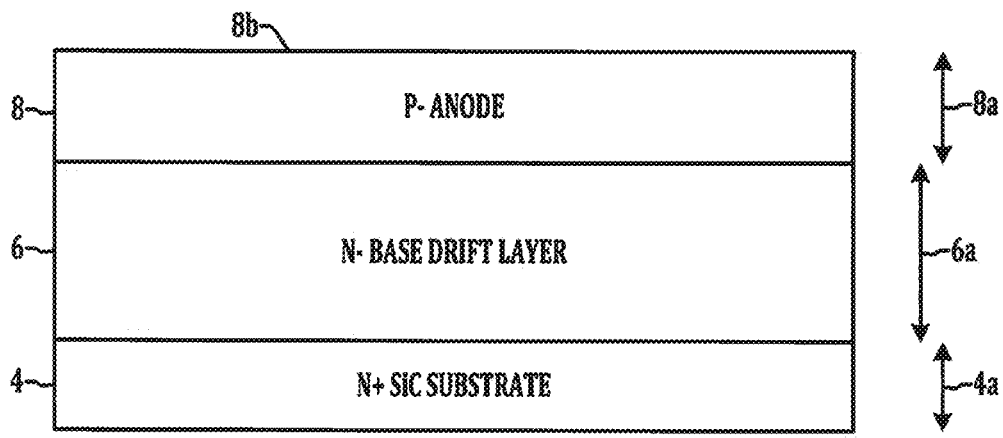
Figure 4C:
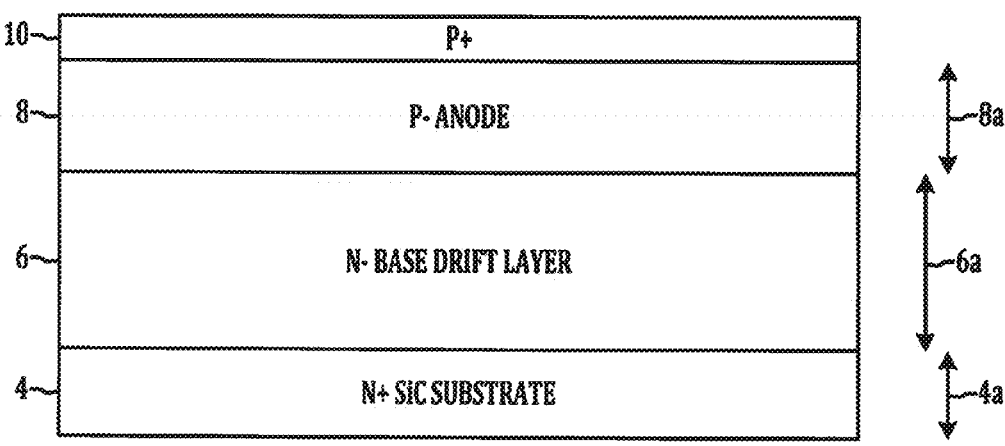
Figure 4D:
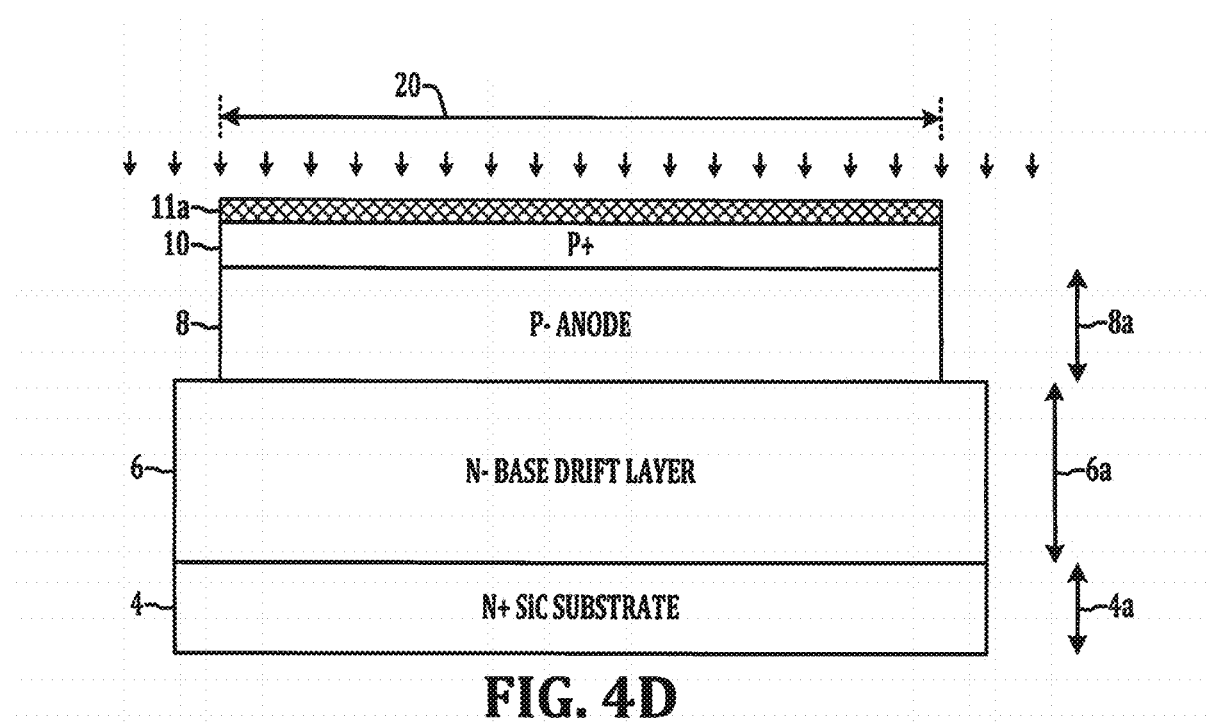
Figure 4E:
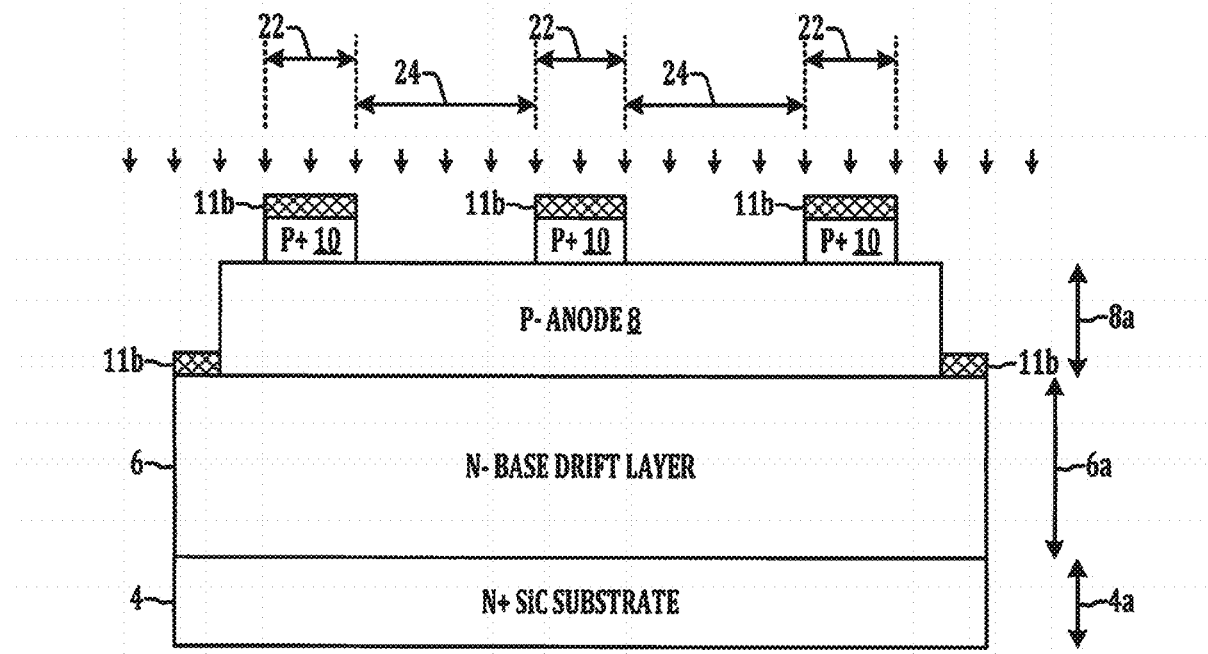
Figure 4F:
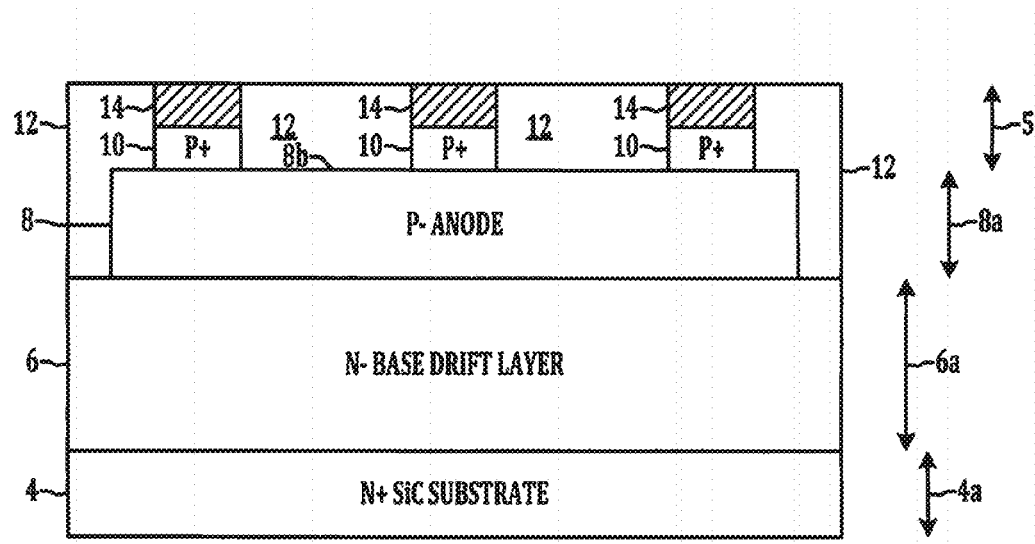
Figure 4G:
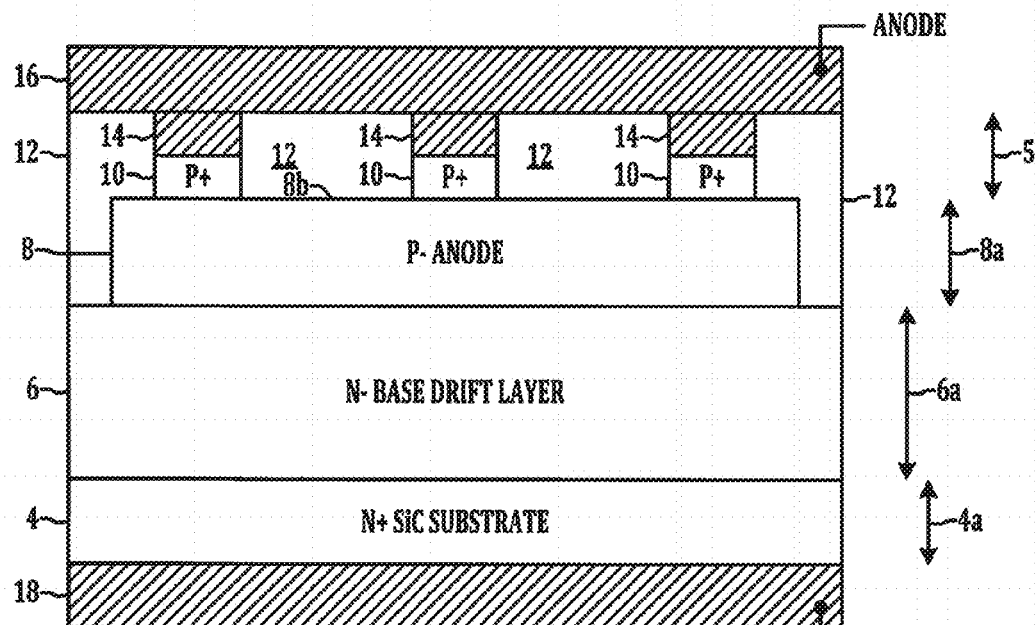

Referring now to FIGS. 3-4G, FIG. 3 illustrates a process or method 50 for fabricating the power rectifier device 2 of FIG. 1, and FIGS. 4A-4G show the device 2 at various intermediate stages of fabrication. At 52 in FIG. 3, the n– drift layer 6 is formed on the n+ silicon carbide substrate 4 by any suitable technique. In certain embodiments, an n-type 4H or 6H SiC substrate 4 is provided, having a dopant concentration of approximately $2 \times 10^{18}$ cm$^{-3}$, which can be formed by any suitable wafer processing techniques. The n type dopants of the starting substrate 4 can be implanted (e.g., phosphorus) or can be introduced (e.g., nitrogen) during epitaxial growth of the substrate 4, where the substrate thickness 4a can be any suitable dimension. As seen in FIG. 4A, in one possible embodiment, an n+ silicon carbide substrate 4 is provided having a thickness 4a, and n type epitaxial silicon 6 is grown over an upper surface of the n+ substrate 4 to any desired thickness 6a at 52. In one implementation, the n– layer 6 is formed by epitaxial growth to provide an n type dopant concentration of about $1 \times 10^{13}$ cm$^{-3}$ to $1 \times 10^{16}$ cm$^{-3}$ and a thickness 4a of about 10 μm to 200 μm at 52.

At 54 in FIG. 3, a p type anode layer or region 8 is formed over the drift layer 6 (e.g., FIG. 4B). In one possible implementation, a p type epitaxial silicon layer 8 is grown on the n– epitaxial drift layer 6 at 54. In another possible approach, a p–implantation process is employed at 54 to implant p type dopants (e.g., boron) into an upper region of the n-epitaxial silicon layer 6 in order to form the lightly doped p type anode layer region 8, where the p type anode layer/region 8 has a thickness 8a and an upper surface 8b as shown in FIG. 4B. In one possible implementation, the p-type emitter or injection anode layer 8 is formed by epitaxial growth to provide a dopant concentration between about $1 \times 10^{17}$ cm$^{-3}$ and $1 \times 10^{19}$ cm$^{-3}$ with a thickness 8a of about 0.1 μm or more and about 10 μm or less. The dopant concentration of the p type anode layer 8 can also be selected so that the p type anode layer 8 functions as an electric field blocking layer when the SiC PiN diode is operated in reverse bias. In this case, the high electric field at the p-type/n-type junction is reduced to a low electric field within the p-type anode layer 8 because the ionized dopant in the p-type layer terminates the electric field lines from the ionized dopant in the n-type layer. The electric field blocking layer can prevent high electric field values from reaching the surface of the p type anode layer 8 in regions where there is no p type anode contact structures 10. Low electric field on the surface of the anode layer 8 in regions where there is not p-type anode contact structures 10 facilitates maintaining low leakage current because high electric field in these regions can lead to avalanche breakdown and current generation.

A heavily doped (p+ doping concentration) p type anode contact structures layer 10 is formed at 56 in FIG. 3 on the p type anode layer/region 8, doped in certain embodiments between about $1 \times 10^{19}$ cm$^{-3}$ and $1 \times 10^{21}$ cm$^{-3}$. In one example, heavily doped p+ epitaxial silicon 10 is formed on or over the p type anode layer/region 8 to form an p type anode contact structures layer 10 as seen in FIG. 4C. In another possible approach, p type dopants (e.g., boron) can be implanted into an upper region of the p type anode layer/ region 8 to form the heavily doped p type anode contact structures layer 10. The heavily doped p+ emitter p type anode contact structures 10 can inject hole carriers from the p+ emitter (anode) through the p type anode layer 8 into the n type drift layer. Because the total surface area of the anode contract structures 10 is reduced from the surface area of the anode layer 8, the SiC PiN diode will have reduced hole carrier injection into the n type drift layer compared to a SiC PiN diode that has a high percentage of surface area or a single anode contract structure.

At 58, a first etch process is employed to etch the p type anode contact structures layer 10 and the p type anode layer 8 using a first etch mask 11a (FIG. 4D) to define the lateral dimension 20 of the p type anode layer 8. Thereafter at 60 in FIG. 3, a second etch process is performed to etch through select portions of the p type anode contact structures layer 10, for example, using a second etch mask 11b, with the etch process stopping approximately at the p type anode layer 8 as seen in FIG. 4E. This last etch process defines the p type anode contact structures 10 having lateral dimensions 22 and spacings 24, wherein the etch processes and associated etch masks at 56 and 60 define the ratio between the anode contact structure upper surface area and the p type anode layer area. Field terminations can be added by implanting boron or aluminum followed by annealing at elevated temperatures (e.g., 1600° C. to 1800° C. in one example) for 1 to 60 minutes in an argon ambient. In other possible embodiments, a self-aligned etch process is employed to pattern the p type anode contact structures 10, for instance, using patterned overlying metal electrical contact structures 14 as an etch mask to etch the p type anode contact structures layer 10.

Thereafter at 62 in FIG. 3, isolation and metallization processing is performed as seen in FIGS. 4F and 4G. In one example, an isolation or passivation material (e.g., interlayer dielectric or ILD) such as silicon dioxide ($SiO_2$) or silicon nitride ($Si_3N_4$) is deposited to form an isolation layer 12 as seen in FIG. 4F, and the isolation layer 12 is patterned and etched to form openings or contact windows above the p type anode contact structures 10. Conductive metal electrical contacts 14 are formed within these openings, such as by deposition of conductive metal material (e.g., nickel or titanium/aluminum). The metal contacts in certain implementations are annealed between 800° C. and 1000° C. for 1 to 10 minutes in an argon or nitrogen ambient, followed by chemical mechanical polishing (CMP) or other suitable processing to form the structure shown in FIG. 4F. Thereafter, an anode metal layer 16 (e.g., gold or aluminum) is deposited over the top of the device for wire bonding as seen in FIG. 4G to provide connection to the upper surfaces of the metal electrical contacts 14, and a lower cathode metal layer 18 is formed along the lower surface of the n+ silicon carbide substrate 4. As seen in the example of FIGS. 1 and 4G, the metal electrical contact layer 14 provides metal electrical contacts to the heavily doped upper surfaces of the p+ contact structures 10, with isolation material 12 formed between laterally spaced contact structures 10, 14. An NiP rectifier (not shown) may be fabricated by reversing the dopant types from 'n type' to 'p type' and vice versa.

Figure 5A:
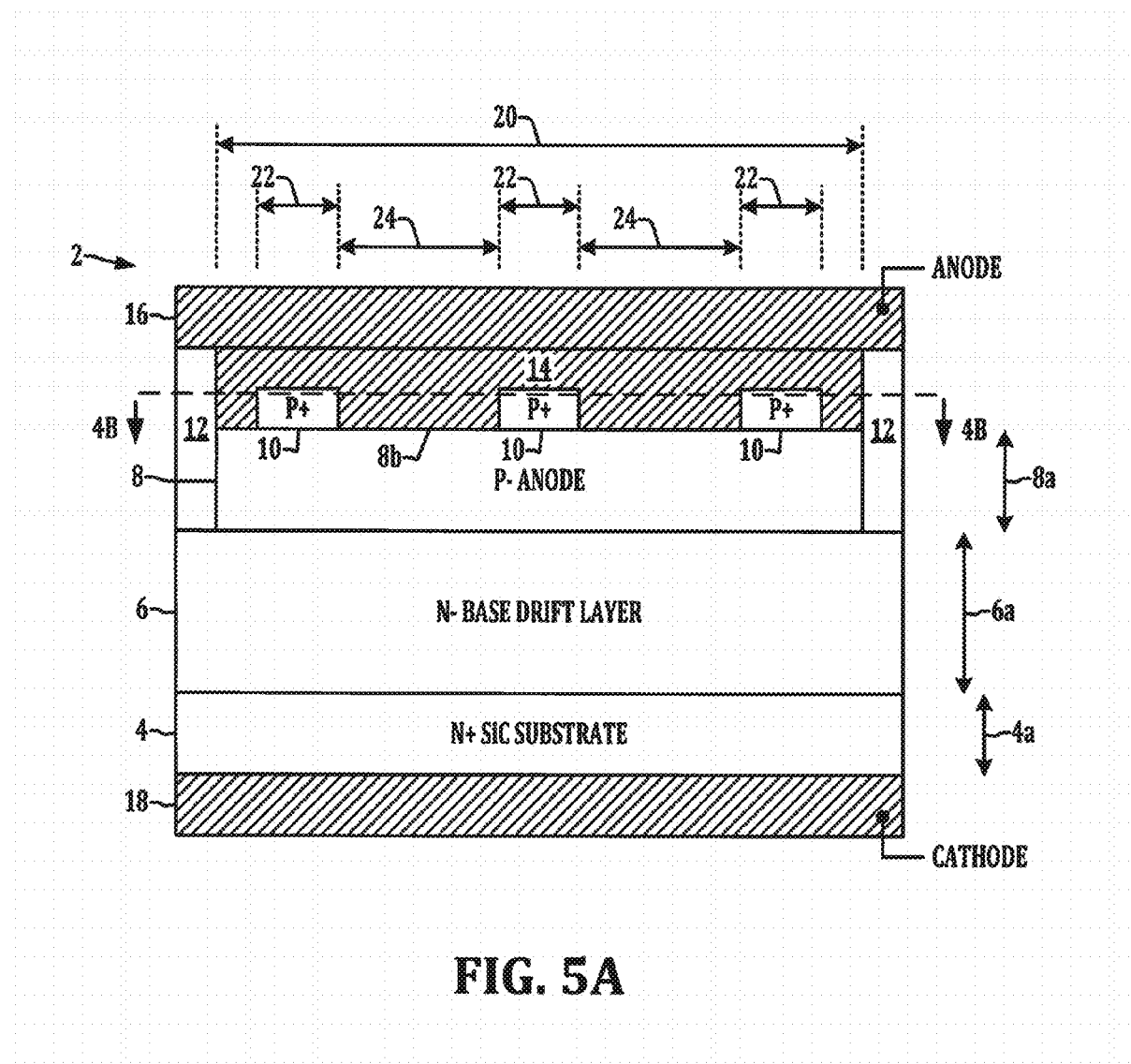
FIGS. 5A and 5B are partial sectional side elevation and top plan views illustrating another exemplary silicon carbide PiN diode with a conductive contact structure overlying anode contact structures and a p type anode layer to form ohmic as well as Schottky contacts.
Figure 5B:
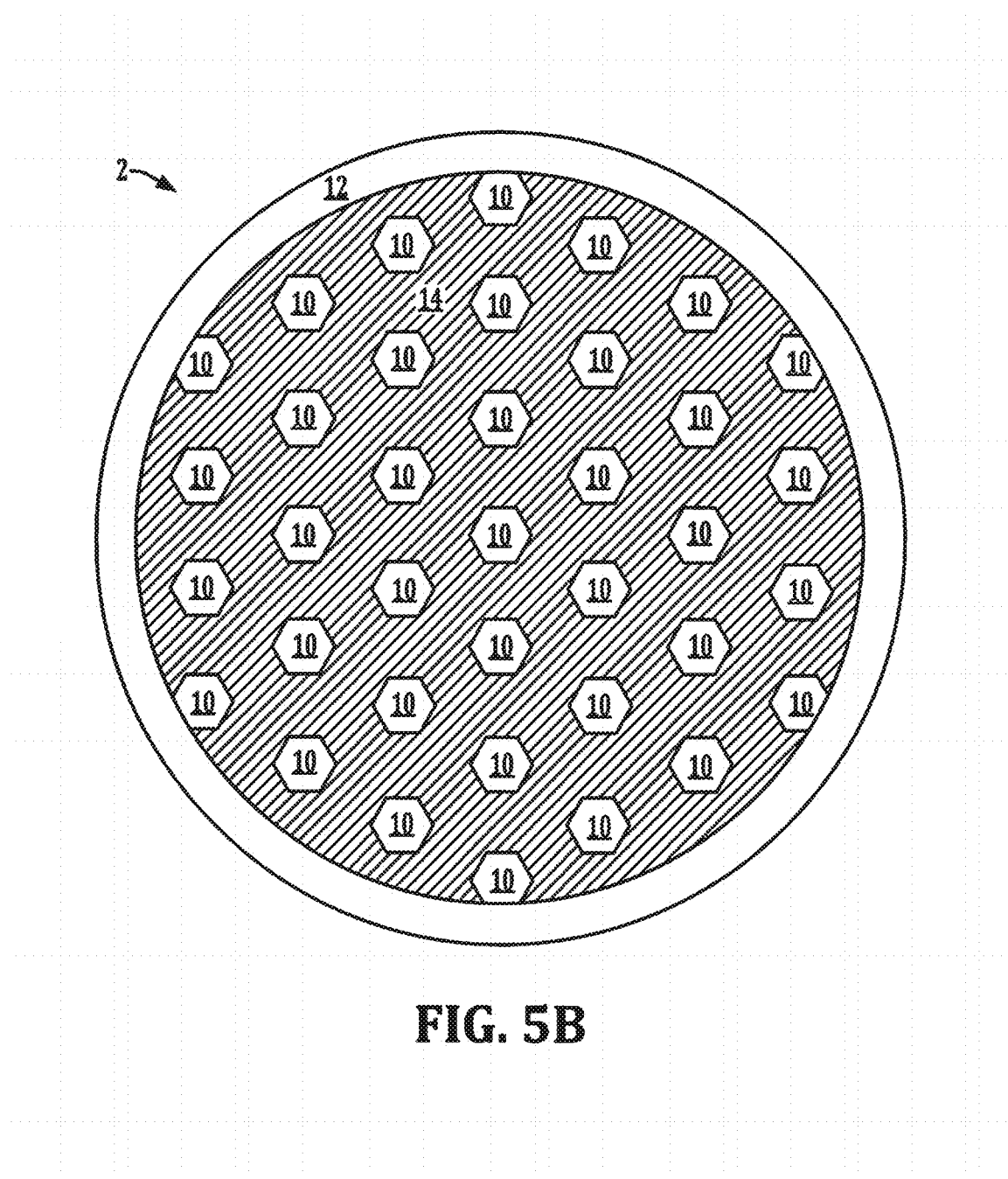

Another possible embodiment is seen in FIGS. 5A and 5B, in which the conductive contact structure 14 is formed over the p type anode contact structures 10 and also over the remaining p type anode layer upper surface 8b, and the anode metal layer 16 is connected to the upper surface of the conductive contact structure 14. In this case, the conductive metal electrical contact structure 14 forms electrical contacts 14 along the upper surfaces of the p type anode contact structures 10 and also forms Schottky contacts along portions of the upper surface 8b of the p type anode layer 8. This structure may be formed, for example, by etching an opening in the isolation material layer 12 generally corresponding to the lateral dimension 20 of the p type anode layer 8 before deposition of the contact material 14 into the opening during the isolation and metallization processing at 62 in the process 50 of FIG. 3.

The low crossover point SiC power rectifier 2 thus provides an integral resistance, via the electrical contact resistance between the p type anode layer 8 and the contact material 14, with a positive temperature coefficient with respect to forward voltage, where the value of this resistance increases with increasing temperature to produce a positive temperature coefficient of forward voltage drop for the device 2, at least in a desired current density range. This crossover point reduction may be a function of one or more of three design characteristics of a given embodiment of the rectifier 2. As seen above, the p type anode contact structures area defined by the upper surfaces of the patterned p+ contacts 10 is much smaller than the upper surface 8b of the p type anode layer 8 as shown in FIG. 1. For high current operation, the resistance (spreading resistance) between adjacent anode contact structures 10 in certain embodiments causes a current crowding effect and the anode layer in the region away from the anode contact structure 10 is de-biased such that injection of holes into the drift n– layer 6 is limited, thereby increasing the diode effective resistance at high current which lowers the crossover point mitigating thermal runaway situations possible in conventional SiC PiN diodes. The reduced injection of holes into the drift p– layer 6 also results in a SiC PiN diode with a reduced density of holes in the drift p– layer. The reduced density of holes in the drift n– layer results in reduced reverse recovery peak current, reduced reverse recovery charge, and reduced reverse recovery time when the diode is switched from forward bias to reverse bias. A low reverse recovery charge is advantageous for a SiC PiN diode operated as a free-wheeling diode because a low reverse recovery charge lowers the turn-on energy loss of an associated switch in a half-bridge configuration.

This p type anode contact area reduction technique may be employed alone or in combination with further refinements by reducing the acceptor doping in the lightly doped emitter or injection p type anode layer 8 and/or by making the layer or region 8 thinner. In certain implementations, for instance, the p type anode layer 8 has a p type dopant concentration of about $1\times10^{17}$ $cm^{-3}$ to $1\times10^{19}$ $cm^{-3}$ or less, such as about $1\times10^{17}$ $cm^{-3}$ or more and about $1\times10^{18}$ $cm^{-3}$ or less, or about $1\times10^{17}$ $cm^{-3}$ in certain embodiments, where the p type anode layer thickness 8a can be about 0.1-10.0 μm, such as about 0.1 μm to 1.0 μm in certain examples, and about 0.1 μm in one embodiment. Also, or separately, the electrical contact resistance at the interface of the p type anode contact structures 10 and the metal electrical contacts 14 can be tailored to provide a positive temperature coefficient with forward voltage, for instance, with a contact resistance of about $1\times10^{-6}$ to $1\times10^{-2}$ $\Omega$ $cm^2$, such as about $1\times10^{-3}$, or about $2\times10^{-5}$ to $5\times10^{-5}$ $\Omega$ $cm^2$ in certain embodiments.

Referring now to FIGS. 6-11, simulations were performed to determine the necessary area of the contact to achieve the desired crossover point reduction. A 'zero temperature coefficient' (ZTC) current may be used to characterize the resulting crossover point reduction, which is expressed as the current at which the temperature coefficient of forward voltage drop is zero. Below the ZTC current, the temperature coefficient of forward voltage drop is negative, and above the ZTC current, the temperature coefficient of forward voltage drop is positive. Thus defined, it is desirable that the ZTC current is a factor of 2 to 5 above the operating current, where a typical operating current density in certain applications is 100 A/$cm^2$.

Figure 6:
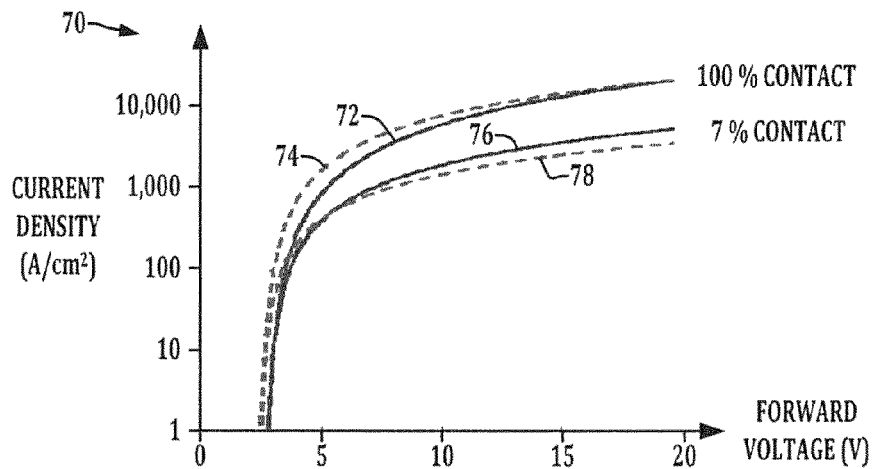
FIG. 6 is a graph illustrating current density as a function of forward voltage for a conventional PiN diode with 100% anode contact coverage and an exemplary silicon carbide PiN diode with 7% anode contact coverage at two different temperatures.

The graph 70 in FIG. 6 shows simulated results of the device 2 in FIG. 1 including ZTC current curves 72 and 74 for a 100% p type anode contact structure coverage at low and higher temperatures, respectively, as well as ZTC current curves 76 and 78 for a 7% p type anode contact structure area embodiment at low and higher temperatures, respectively. For the 100% SiC PiN rectifier device (curves 72 and 74), the zero temperature coefficient occurs at very high current densities (e.g., over 10,000 amps/$cm^2$). If the contact width is limited to 7% of the full contact (curves 76 and 78 in FIG. 6), a ZTC current of 500 A/$cm^2$ results, representing a significant enhancement in reliability with only a relatively small (e.g., 5%) penalty in forward current.

One embodiment of the diode 2 was fabricated on a 4H silicon carbide substrate 4 with a dopant concentration of $2\times10^{18}$ cm$^{-3}$, with the following layers being grown by chemical vapor deposition (CVD): a 5 µm n+ buffer layer, a 30 µm n− drift layer 6 (1-5×10$^{15}$ cm$^{-3}$), a spreading resistance/injection p type anode layer 8 (2 µm thickness 8a with dopant concentration of 2-1×10$^{17}$ cm$^{-3}$), and a p-type anode contact structures layer 10 (8.5×10$^{19}$ cm$^{-3}$) with a thickness of about 0.5 µm. The p type anode contact structures patterning in this case was as shown in FIG. 2C above, with the p type anode contact structures 10 being formed by inductively coupled plasma reactive ion etching (ICP-RIE) to a depth about halfway through the p type anode layer 8. An additional etch was performed to isolate the p type anode layer 8, where oxide passivation of the p− side included a 16 hour dry oxidation and a 2 hour nitridization, topped by 1.1 µm of plasma enhanced chemical vapor deposition (PECVD) oxide 12. Openings in the passivation layer 12 were patterned only into the tops of the p+ contact mesas 10 to prevent any unintentional contact to the spreading resistance/p type anode layer 8. For both sides of the wafer, the metal electrical contact metal was 10 nm thick titanium followed by 100 nm nickel, alloyed at 900° C. for 5 minutes. On the upper (p) side, 10 nm titanium followed by 0.5 µm gold probe pads were added, covering the entire anode. The rectifiers were tested by varying the base-plate temperature from 30° C. to 250° C. while measuring the current voltage characteristics using a Tektronics 371 curve tracer in pulse mode such that no heating was caused by the measurement itself.

Figure 7:
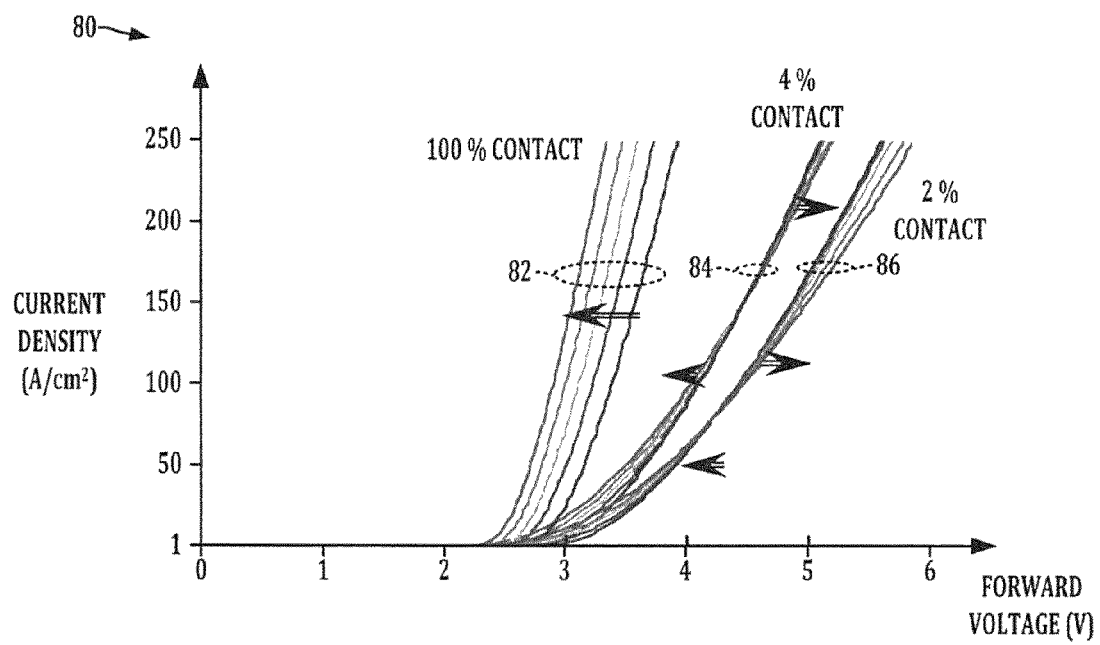
FIG. 7 is a graph illustrating current density as a function of forward voltage for exemplary PiN diodes having 100%, 4% and 2% anode contact coverage at different temperatures at moderate current densities.

Graph 80 in FIG. 7 shows the results of the measurements for three different rectifiers with varying total emitter contact area, in which each set of ZTC current curves 82, 84 and 86 includes multiple curves for different temperatures, with the arrows in the graph 80 showing increasing temperature. The ZTC current varied from 50-100 A/cm$^2$ with 2% anode area (curves 86) to approximately 150 A/cm$^2$ with a 4% anode coverage (curves 84), where the curves 82 are for a device with 100% anode coverage. The 4% anode rectifier (curves 84) showed the highest degree of crossover point reduction which agreed closely with the simulations. A 10% anode area rectifier (not shown in the graph 80 of FIG. 7) yielded a ZTC current of approximately 1000 A/cm$^2$. However, a higher penalty to the forward current was also discovered requiring additional optimization of the structure.

In other embodiments, the SiC p type anode layer 8 is a moderately doped spreading resistance or injection p type anode layer, topped by a more heavily doped p type anode contact structures layer 10, with mesas etched through the p type anode contact structures layer 10 to limit the p type anode contact structures area percentage. A hexagonal grid of p type anode contact structure mesas 10 over the p type anode layer 8 is chosen to optimize current injection uniformity and the contact mesa dimensions were varied in the mask to give mesas covering 2, 4, 10, 20, 40, and 100% of the anode mesa to test the variation with contact fraction, and devices of different total areas were constructed in a range from 8×10$^{-5}$ cm$^2$ to 4.5×10$^{-3}$ cm$^2$ to evaluate high current density levels.

Three variations of the design were grown, fabricated, and tested. For all three variations, the wafers included a 4H SiC substrate 4 with a 5 µm n+ buffer layer, a 30-40 µm n− drift layer 6 (1-5×10$^{15}$ cm$^{-3}$), a p type anode (spreading resistance/injection) layer 8 (1-2 µm, dopant concentration of about 2×10$^{17}$ cm$^{-3}$ to 1×10$^{17}$ cm$^{-3}$), and a 0.2 µm to 0.5 µm p+ contact layer 10, all sequentially grown in a commercial warm-walled chemical vapor deposition (CVD) reactor. In the baseline design the p+ contact doping in the layer 10 was 8.5×10$^{19}$ cm$^{-3}$ and the p type anode contact structures 10 were etched by ICPRIE to a depth approximately halfway through the spreading resistance/p type anode layer 8. For the low-current crowding design, another quarter of the same wafer was processed with shallower p type anode contact structure etching, barely into the spreading resistance/p type anode layer 8. For the low-resistance design, a wafer was produced with much higher p+ contact doping (5×10$^{20}$ cm$^{-3}$) and p type anode contact structure etch similar to the baseline design. The remaining processing steps were common to all the wafers. An oxide passivation layer 12 was formed on the p-side using a 16 hour dry oxidation at 1150° C. and a 2 hour NO-nitridization at 1175° C., topped by 1.1 µm of PECVD oxide. Openings in the isolation layer 12 were patterned only into the tops of the p+ contact mesa structures 10 to prevent any unintentional contact to the spreading resistance/p type anode layer 8. For both sides of the wafer, the electrical contact metal was Ni/Ti (100+10 nm), alloyed at 900° C. for 5 minutes in nitrogen. On the p-side, thick Au/Ti probe pads were added, covering the entire anode. No high-voltage edge termination was included in this fabrication sequence since the devices were intended for exploring forward bias behavior.

Figure 8:
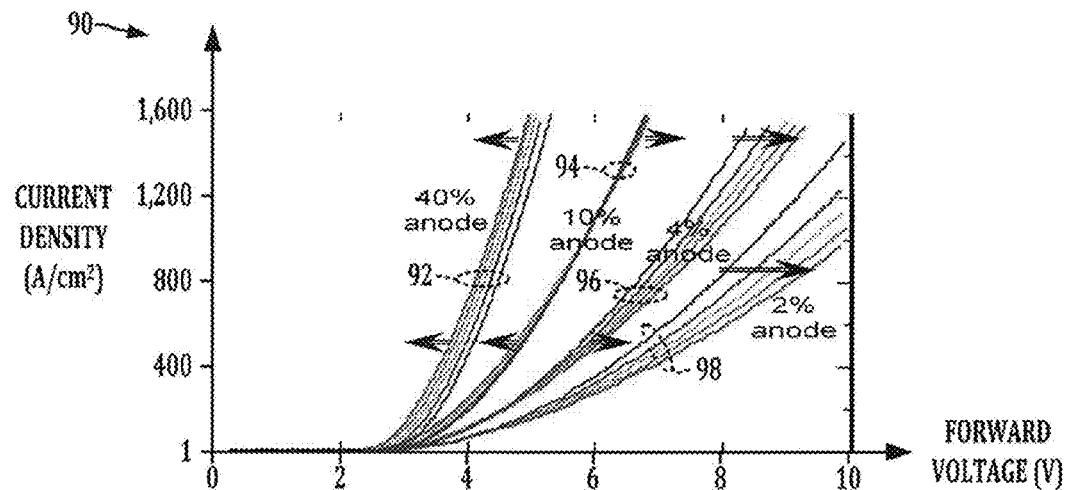
FIG. 8 is a graph illustrating current density as a function of forward voltage for exemplary PiN diodes having 40%, 10%, 4% and 2% anode contact coverage at high current densities.

Referring also to FIGS. 7 and 8, testing was conducted in wafer-form on a probe station with a heated chuck using a DC source measurement unit at low current densities and a 4-wire pulsed curve tracer (Tektronix 371B) at higher current densities. The forward-bias temperature behavior of baseline design devices with various electrical contact mesa coverages are shown in graphs 80 and 90 of FIGS. 7 and 8. The undesirable PiN negative temperature coefficient is clearly seen in the 100% coverage curves 82 of FIG. 7, whereas different behavior is seen for the smallest electrical contact coverage (2% curves 86), where dV/dT becomes positive above 75 A/cm$^2$. At 4% coverage (curves 84), the cross-over is at about 140-170 A/cm$^2$.

The graph 90 in FIG. 8 illustrates higher current densities for one of the smaller devices, which includes curves 92 for a 40% coverage example, as well as curve sets 94, 96 and 98 for 10%, 4% and 2% coverage devices, respectively, where the arrows show increasing temperature for the associated curve sets. At 10% coverage (curves 94), the temperature coefficient is nearly zero and above 10%, the dV/dT remains negative at all reasonable values of current density. The reverse-bias characteristics of all the PiNs were normal (~10$^{-8}$ A/cm$^2$ at −500V), which is an order of magnitude lower leakage current than is normally seen in comparable SiC Schottky rectifier devices. In the low-current-crowding devices, the cross-over current density was indistinguishable from the baseline devices with the same metal electrical contact percentage. The cross-over value for 2% coverage devices (curves 98 in FIG. 8) was 50-100 A/cm$^{-2}$ and the 10% coverage devices showed nearly zero dV/dT (curves 94). Certain 10% device embodiments have nearly zero temperature dependence over the temperature range from 30 to 240° C., up to 1000 A/cm$^2$. Embodiments, moreover, can be temperature compensated, wherein FIG. 8 shows that the curves 94 with 10 percent anode area is temperature compensated. Thus, the disclosed device can both lower the crossover point and for selected designs be temperature compensated to some level of temperature compensation. For FIGS. 7 and 8, the current density cross-over points for these devices are as follows:

FIG. 7

| | |
|---|---|
| 2% | 75 A/cm² |
| 4% | 155 A/cm² |
| 10% | 1000 A/cm² |
| >10% | no crossover |

FIG. 8

| | |
|---|---|
| 2% | 75 A/cm² |
| 4% | 170 A/cm² |
| 10% | 1100 A/cm² |
| >10% | no crossover |

Figure 9:
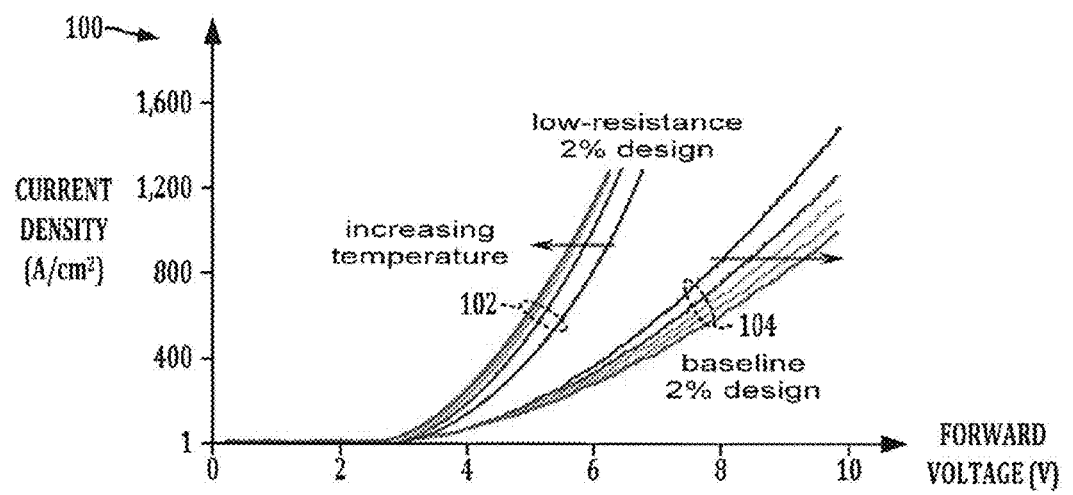
FIG. 9 is a graph illustrating current density as a function of forward voltage for exemplary baseline and low-resistance designs with 2% anode contact coverage at various temperatures.
Figure 10:
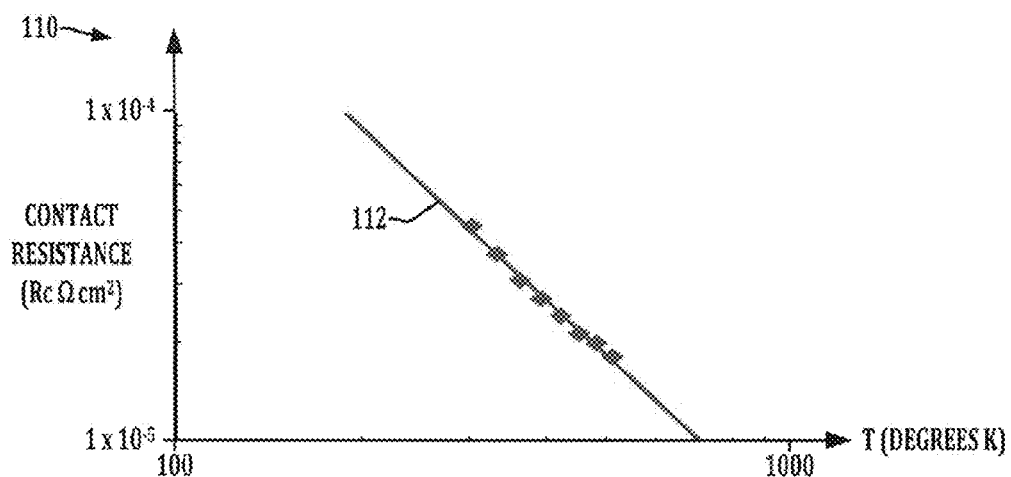
FIG. 10 is a graph illustrating ohmic contact resistance as a function of temperature for a highly doped low-resistance electrical contact design.

Graph 100 in FIG. 9 illustrates curves 102 and 104 for the smallest coverage devices with one set of curves 102 showing a low-resistance embodiment and the other set 104 illustrating a baseline design, each with about 2% coverage. As seen in FIG. 9, a significant change was found for the low resistance design (curves 102), and this undesirable negative temperature coefficient persisted at nearly all temperatures and current densities for all of the metal electrical contact percentages. The presence of six times higher acceptor concentration made a substantial reduction in the series resistance and increased any cross-over to above 1,200 A/cm². This wafer also contained test structures allowing independent quantification of the contact resistance. Four-contact Kelvin, linear TLM, and circular TLM patterns all showed that the specific contact resistance for this highly-doped p+ contact 10 was $4.5 \times 10^{-5}$ Ω·cm² at 30° C. For this doping level, the contact resistance no longer has a positive temperature coefficient. In fact, as seen in the graph 110 of FIG. 10, the contact resistance 112 approximately follows $R(T)=R_0 \cdot (T/T_0)^\delta$, with $\delta \approx -1.72$.

Figure 11:
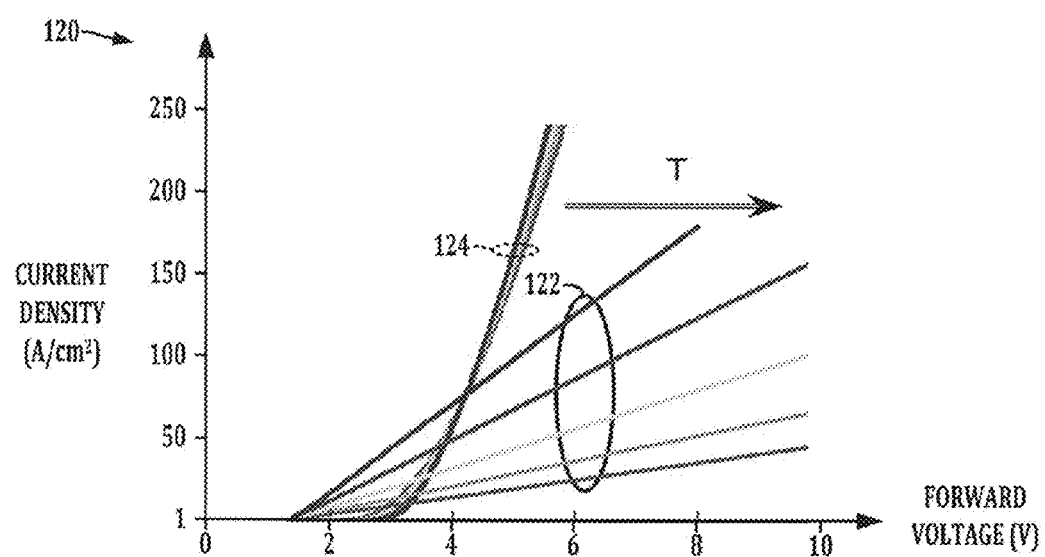
FIG. 11 is a graph illustrating current density as a function of forward voltage for a junction bipolar Schottky (JBS) rectifier and an exemplary silicon carbide PiN diode with 2% anode contact coverage.

FIG. 11 shows a graph 120 illustrating curves 122 for a Junction Barrier Schottky (JBS) barrier power rectifier and curves 124 for a 2% coverage device 2 according to the present disclosure. In this regard, alternative SiC rectifiers with positive temperature coefficient exist (e.g., the compared JBS device), but the advantage of the new low crossover point SiC PiN power rectifier 2 is seen in the improved ZTC curves 124 of FIG. 11. As seen, the rectifier 2 has less temperature dependence and superior current density capability, particularly for higher junction temperatures where the rectifiers typically operate. Moreover, the forward voltages for the restricted metal electrical contacts in the baseline design are higher than for a normal broad-area PiN p contact, but this forward voltage penalty is not as large as in JBS rectifiers over much of the operating range. FIG. 11 shows a direct comparison of a positive-temperature coefficient SiC PiN 2 (curves 124) with measurements for a SiC JBS rectifier (curves 122) with similar active area. The PiN voltage is lower for the exemplary device 2 than that of the JBS device over a wide range of temperatures and currents. This advantage is largest for high temperature operation, where Schottky junctions exhibit particularly high Vf.

The rectifier in certain embodiments has a positive or zero temperature coefficient of forward voltage drop for current densities of about 100 A/cm² or less. In certain embodiments, moreover, the rectifier has a positive or zero temperature coefficient of forward voltage drop for current densities of about 500 A/cm² or less.

The two design variations confirm that p+ contact resistance is the driver behind the positive temperature coefficient seen for the baseline design. The elimination of cross-over behavior for the low contact-resistance design is the clearest demonstration that the p+ contact resistance is the controlling factor in this device 2. The fact that the measured temperature coefficient for the highly doped contact is negative implies that there may be a transition in the nature of the p+ contact resistance for doping between $8.5 \times 10^{19}$ cm⁻³ and $5 \times 10^{20}$ cm⁻³. The low current-crowding design tested whether the geometrical restriction of high current flow in the current-spreading resistance/p-type anode layer 8 is contributing to the effect. By doubling the thickness of the spreading resistance/p type anode layer 8, the degree of current-crowding is greatly reduced. That this change had no effect on the cross-over current density implies that current crowding is not a significant factor in these devices. The baseline devices have been successfully modeled using SILVACO's ATLAS code. The simulation results correspond well with experiment when the p+ contact resistance temperature dependence was assumed to follow the formula $R(T)=R_0 \cdot (T/T_0)^\delta$, and the modeling showed that the baseline contact resistance is more than a factor of ten larger than in the low-resistance design at room temperature.

Both the modeling and the experimental results show that, by limiting the p+ contact area, the SiC PiN dV/dT cross-over can be moved into the technologically useful current range with Vf=4-5 V. This voltage is far lower than the cross-over caused by electron-hole scattering at extremely high currents, which in solid anode devices occurs at 8-9 V and current densities in excess of 1000 A/cm². These results therefore demonstrate that a positive forward-bias temperature coefficient can be achieved in SiC PiN diodes through combination of one or more of moderate p-contact doping and restricted anode contact structures 10 on the p type anode layer 8. This novel design is robust, simple to implement, and retains the other positive properties of SiC PiN diodes such as minimal reverse leakage current and high current capability. These devices have the potential to greatly expand the opportunity for use of SiC PiNs in ganged parallel high-current applications while avoiding or mitigating the above-mentioned thermal runaway situations.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been illustrated and/or described with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The following is claimed:

1. A rectifier, comprising:
   an n type drift layer disposed over an n type silicon carbide substrate, the n type drift layer having a dopant concentration less than a dopant concentration of the n type silicon carbide substrate;
   a p type anode layer disposed on the n type drift layer and having an upper surface;
   a plurality of p type anode contact structures disposed on the upper surface of the p type anode layer, individual p type anode contact structure being laterally spaced from one another and having a higher dopant concentration than the p type anode layer, wherein the total upper surface area of the plurality of p type anode contact structures is less than about 50% of the surface area of the upper surface of the p type anode layer;
a plurality of electrical contacts individually disposed along an upper surface of a corresponding one of the p type anode contact structures;
an anode metal layer connected to upper surfaces of the plurality of electrical contacts; and
a cathode metal layer connected to a lower surface of the n type silicon carbide substrate.

2. The rectifier of claim 1, wherein the total upper surface area of the plurality of p type anode contact structures is less than or equal to about 20% of the surface area of the upper surface of the p type anode layer.

3. The rectifier of claim 2, wherein the total upper surface area of the plurality of p type anode contact structures is less than or equal to about 10% of the surface area of the upper surface of the p type anode layer.

4. The rectifier of claim 3, wherein the total upper surface area of the plurality of p type anode contact structures is less than or equal to about 5% of the surface area of the upper surface of the p type anode layer.

5. The rectifier of claim 4, wherein the total upper surface area of the plurality of p type anode contact structures is about 2% of the surface area of the upper surface of the p type anode layer.

6. The rectifier of claim 1, wherein the p type anode layer has a dopant concentration of about $1\times10^{17}$ cm$^{-3}$ or more and about $1\times10^{19}$ cm$^{-3}$ or less.

7. The rectifier of claim 6, wherein the p type anode layer has a dopant concentration of about $1\times10^{17}$ cm$^{-3}$ or more and about $1\times10^{18}$ cm$^{-3}$ or less.

8. The rectifier of claim 7, wherein the p type anode layer has a dopant concentration of about $1\times10^{17}$ cm$^{-3}$.

9. The rectifier of claim 6, wherein the p type anode layer has a thickness of about 0.1 μm or more and about 10.0 μm or less.

10. The rectifier of claim 9, wherein the p type anode layer has a thickness of about 0.1 μm or more and about 1.0 μm or less.

11. The rectifier of claim 10, wherein the p type anode layer has a thickness of about 0.1 μm.

12. The rectifier of claim 1, wherein the p type anode layer has a thickness of about 0.1 μm or more and about 10.0 μm or less.

13. The rectifier of claim 12, wherein the p type anode layer has a thickness of about 0.1 μm or more and about 1.0 μm or less.

14. The rectifier of claim 13, wherein the p type anode layer has a thickness of about 0.1 μm.

15. The rectifier of claim 1, wherein the plurality of electrical contacts provide a contact resistance with the corresponding p type anode contact structures of about $1\times10^{-6}$ Ω cm$^2$ or more and about $1-10^{-4}$ Ω cm$^2$ or less.

16. The rectifier of claim 15, wherein the plurality of electrical contacts provide a contact resistance with the corresponding p type anode contact structures of about $2\times10^{-5}$ Ω cm$^2$ or more and about $5\times10^{-5}$ Ω cm$^2$ or less.

17. The rectifier of claim 15, wherein the total upper surface area of the plurality of p type anode contact structures is less than or equal to about 20% of the surface area of the upper surface of the p type anode layer.

18. The rectifier of claim 17, wherein the p type anode layer has a dopant concentration of about $1\times10^{17}$ cm$^{-3}$ or more and about $1\times10^{19}$ cm$^{-3}$ or less, and wherein the p type anode layer has a thickness of about 0.1 μm or more and about 10.0 μm or less.

19. The rectifier of claim 1, wherein the plurality of electrical contacts provide a contact resistance with the corresponding p type anode contact structures of about $1\times10^{-3}$ Ω cm$^2$.

20. The rectifier of claim 1, comprising a conductive contact structure formed over the plurality of p type anode contact structures and over at least one portion of the upper surface of the p type anode layer, the conductive contact structure forming the plurality of electrical contacts along the upper surfaces of the p type anode contact structures and at least one Schottky contact disposed along the at least one portion of the upper surface of the p type anode layer, wherein the anode metal layer is connected to an upper surface of the conductive contact structure.

21. The rectifier of claim 1, wherein the rectifier has a positive or zero temperature coefficient of forward voltage drop for current densities of about 100 A/cm$^2$ or less.

22. The rectifier of claim 1, wherein the rectifier has a positive or zero temperature coefficient of forward voltage drop for current densities of about 500 A/cm$^2$ or less.

23. A rectifier, comprising:
a drift layer disposed over a silicon carbide substrate, the drift layer having a dopant concentration of a first conductivity type less than a dopant concentration of the first conductivity type of the silicon carbide substrate;
an anode layer of a second conductivity type disposed on the drift layer and having an upper surface;
a plurality of anode contact structures of the second conductivity type disposed on the upper surface of the anode layer, individual anode contact structures being laterally spaced from one another and having a higher dopant concentration than the anode layer, wherein the total upper surface area of the plurality of anode contact structures is less than about 50% of the surface area of the upper surface of the anode layer;
a plurality of electrical contacts individually disposed along an upper surface of a corresponding one of the anode contact structures;
an anode metal layer connected to upper surfaces of the plurality of electrical contacts; and
a cathode metal layer connected to a lower surface of the n type silicon carbide substrate.

24. A rectifier, comprising:
a semiconductor substrate;
a first layer disposed over the semiconductor substrate, the first layer having a dopant concentration of a first conductivity type less than a dopant concentration of the first conductivity type of the semiconductor substrate;
an anode layer of a second conductivity type disposed on the first layer and having an upper surface;
an anode contact structure of the second conductivity type disposed on the upper surface of the anode layer, the anode contact structure having a higher dopant concentration than the anode layer, wherein the total upper surface area of the anode contact structure is less than about 50% of the surface area of the upper surface of the anode layer;
an electrical contact disposed along an upper surface of the anode contact structure;
an anode metal layer connected to an upper surface of the electrical contact; and
a cathode metal layer connected to a lower surface of the semiconductor substrate.

25. The rectifier of claim 24, wherein the first conductivity type is "n" and the second conductivity type is "p".

26. The rectifier of claim 24, wherein the first layer is a drift layer.

27. The rectifier of claim 24, comprising a plurality of anode contact structures of the second conductivity type disposed on the upper surface of the anode layer, individual anode contact structures being laterally spaced from one another and having a higher dopant concentration than the anode layer, the plurality of anode contact structures having a total upper surface area less than a surface area of the upper surface of the anode layer;
    a plurality of electrical contacts individually disposed along an upper surface of a corresponding one of the anode contact structures; and
    wherein the anode metal layer is connected to upper surfaces of the plurality of electrical contacts.

28. The rectifier of claim 24, wherein the semiconductor substrate is a silicon carbide substrate.

29. The rectifier of claim 24, wherein the semiconductor substrate is a gallium nitride substrate.

30. A method of making a rectifier, comprising:
    providing a semiconductor substrate;
    disposing a first layer over the semiconductor substrate;
    ensuring the first layer has a dopant concentration of a first conductivity type less than a dopant concentration of the first conductivity type of the semiconductor substrate;
    disposing an anode layer of a second conductivity type having an upper surface on the first layer;
    disposing an anode contact structure of the second conductivity type on the upper surface of the anode layer;
    ensuring the anode contact structure has a higher dopant concentration than the anode layer and the total upper surface area of the anode contact structure is less than about 50% of the surface area of the upper surface of the anode layer;
    disposing an electrical contact along an upper surface of the anode contact structure;
    connecting an anode metal layer to an upper surface of the electrical contact; and
    connecting a cathode metal layer to a lower surface of the semiconductor substrate.

\* \* \* \* \*